US011310879B1

(12) United States Patent
Zhao et al.

(10) Patent No.: US 11,310,879 B1
(45) Date of Patent: Apr. 19, 2022

(54) ADAPTIVE FEEDBACK CONTROL IN LED DRIVING CIRCUITS

(71) Applicant: Monolithic Power Systems, Inc., San Jose, CA (US)

(72) Inventors: Junjian Zhao, San Jose, CA (US); Chia-Lung Ni, New Taipei (TW); Zheng Luo, San Jose, CA (US); Yu-Huei Lee, New Taipei (TW); Huan Liu, Chengdu (CN)

(73) Assignee: Monolithic Power Systems, Inc., San Jose, CA (US)

( * ) Notice: Subject to any disclaimer, the term of this patent is extended or adjusted under 35 U.S.C. 154(b) by 0 days.

(21) Appl. No.: 17/168,608

(22) Filed: Feb. 5, 2021

(51) Int. Cl.
*H05B 45/10* (2020.01)
*H05B 45/14* (2020.01)
*H03K 3/0233* (2006.01)
*H05B 45/46* (2020.01)
*H03K 5/24* (2006.01)
*H03K 19/20* (2006.01)

(52) U.S. Cl.
CPC .......... *H05B 45/14* (2020.01); *H03K 3/0233* (2013.01); *H03K 5/24* (2013.01); *H03K 19/20* (2013.01); *H05B 45/46* (2020.01)

(58) Field of Classification Search
CPC combination set(s) only.
See application file for complete search history.

(56) References Cited

U.S. PATENT DOCUMENTS

| 8,525,423 B2 | 9/2013 | Yu et al. | |
| 9,998,009 B1 | 6/2018 | Lai et al. | |
| 2006/0272118 A1* | 12/2006 | Kawada | B60S 1/0807 |
| | | | 15/250.13 |
| 2010/0264837 A1 | 10/2010 | Zhao | |
| 2013/0342124 A1* | 12/2013 | Huang | H05B 45/38 |
| | | | 315/210 |
| 2014/0292220 A1* | 10/2014 | Trattler | H05B 45/3725 |
| | | | 315/287 |
| 2020/0363360 A1* | 11/2020 | Smith | G01N 33/49 |

* cited by examiner

*Primary Examiner* — Long Nguyen
(74) *Attorney, Agent, or Firm* — Perkins Coie LLP

(57) ABSTRACT

A feedback control circuit in an LED driving circuit for driving a plurality of LED strings. Each LED string provides a headroom detecting voltage. The feedback control circuit has a status detecting circuit, a counting circuit and a modulating circuit. The status detecting circuit compares each headroom detecting voltage with a low headroom threshold voltage and a high headroom threshold voltage and generates an up self-status signal and a down self-status signal. The counting circuit counts or keeps unchanged and then generates a counting signal based on the up self-status signal and the down self-status signal. The modulating circuit generates a modulating signal based on the counting signal. And based on the modulating signal, the feedback control circuit generates a feedback control signal to regulate a bias voltage supplying the plurality of LED strings.

18 Claims, 10 Drawing Sheets

ADAPTIVE FEEDBACK CONTROL IN LED DRIVING CIRCUITS

FIELD OF THE INVENTION

The present invention relates generally to electronic circuits, and more particularly but not exclusively to adaptive feedback control in LED (Light Emitting Diode) driving circuits.

BACKGROUND OF THE INVENTION

LED (Light Emitting Diode) driving circuits are used to drive a plurality of LED strings. The plurality of LED strings receive a bias voltage as an input power supply. In operation, the LED driving circuit generates a feedback control signal which is used to regulate the bias voltage so that the bias voltage is regulated at a desired level in respect to the characteristics of the LED strings. Thus, an LED driving circuit and a feedback control circuit therein is desired to at least address the above-mentioned purpose.

SUMMARY

Embodiments of the present invention are directed to a feedback control circuit used in an LED (Light Emitting Diode) driving circuit driving a plurality of LED strings, wherein each LED string has a first terminal and a second terminal, and the plurality of LED strings receive a bias voltage at the first terminals and provide at the second terminals a plurality of headroom detecting voltages having a one-to-one correspondence with the second terminals of the plurality of LED strings, the feedback control circuit comprising: a status detecting circuit configured to receive the plurality of headroom detecting voltages and to generate an up self-status signal based on comparing each headroom detecting voltage with a low headroom threshold voltage and a down self-status signal based on comparing each headroom detecting voltage with a high headroom threshold voltage; a counting circuit configured to generate a counting signal counting in a first direction or in a second direction opposite to the first direction or keeping unchanged based on the up self-status signal and the down self-status signal; and a modulating circuit configured to generate a modulating signal varying with the counting signal; wherein the feedback control circuit is configured to generate a feedback control signal based on the modulating signal.

Embodiments of the present invention are also directed to a method for generating a feedback control signal for regulating a bias voltage used for supplying a plurality of LED strings, wherein each LED string has a first terminal and a second terminal, and the plurality of LED strings receive a bias voltage at the first terminals and provide at the second terminals a plurality of headroom detecting voltages having a one-to-one correspondence with the second terminals of the plurality of LED strings, the method comprising: comparing each headroom detecting voltage with a high headroom threshold voltage and a low headroom threshold voltage; generating a modulating signal based on the comparison between each headroom detecting voltage and the high headroom threshold voltage and the comparison between each headroom detecting voltage and the low headroom threshold voltage, wherein the modulating signal decreases when any of the headroom detecting voltages is lower than the low headroom threshold voltage, the modulating signal increases when each of the headroom detecting voltages is higher than the high headroom threshold voltage, and the modulating signal keeps unchanged when each of the headroom detecting voltages is between the low headroom threshold voltage and the high headroom threshold voltage; and generating the feedback control signal based on the modulating signal, wherein the feedback control signal is used for regulating the bias voltage so that each of the headroom detecting voltages is between the high headroom threshold voltage and the low headroom threshold voltage.

Embodiments of the present invention are further directed to a LED driving system driving a plurality of LED strings, wherein each LED string has a first terminal and a second terminal, and the plurality of LED strings receive a bias voltage at the first terminals and provide at the second terminals a plurality of headroom detecting voltages having a one-to-one correspondence with the second terminals of the plurality of LED strings, the LED driving system comprising: a feedback control circuit, comprising: a status detecting circuit configured to receive the plurality of headroom detecting voltages and to generate an up self-status signal based on comparing each headroom detecting voltage with a low headroom threshold voltage and a down self-status signal based on comparing each headroom detecting voltage with a high headroom threshold voltage; a counting circuit configured to generate a counting signal counting in a first direction or in a second direction opposite to the first direction or keeping unchanged based on the up self-status signal and the down self-status signal; and a modulating circuit configured to generate a modulating signal varying with the counting signal; wherein based on the modulating signal, the feedback control circuit is configured to generate a feedback control signal, and a voltage converter coupled to the feedback control circuit to receive the feedback control signal and configured to generate the bias voltage based on the feedback control signal.

DESCRIPTION OF THE DRAWINGS

The present invention can be further understood with reference to the following detailed description and the appended drawings, wherein like elements are provided with like reference numerals.

DESCRIPTION

Figure 1:
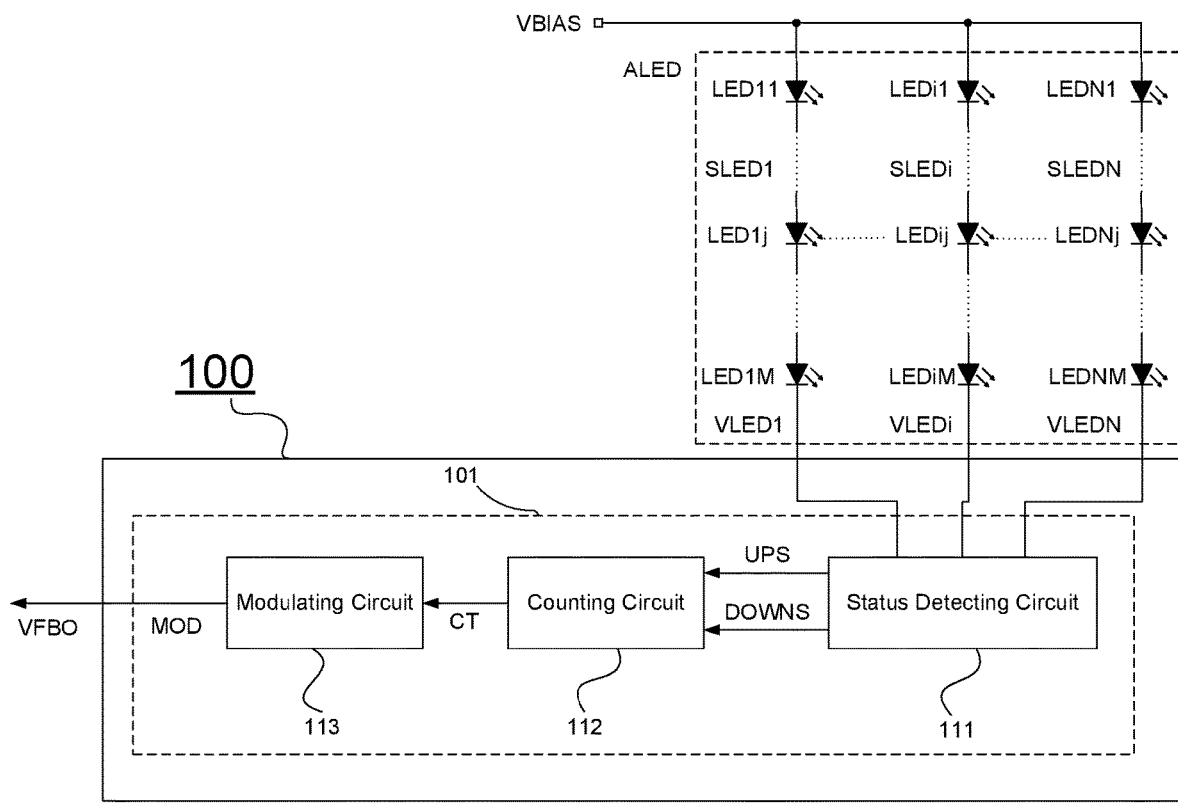
FIG. 1 schematically illustrates an LED driving circuit 100 in accordance with an embodiment of the present invention.

The present invention is now described. While it is disclosed in its preferred form, the specific embodiments of the invention as disclosed herein and illustrated in the drawings are not to be considered in a limiting sense. Rather, these embodiments are provided so that this invention will be thorough and complete, and will fully convey the scope of the invention to those skilled in the art. Indeed, it should be readily apparent in view of the present description that the invention may be modified in numerous ways. Among other things, the present invention may be embodied as devices, methods, software, and so on. Accordingly, the present invention may take the form of an entirely hardware embodiment, an entirely software embodiment or an embodiment combining software and hardware aspects. The following detailed description is, therefore, not to be taken in a limiting sense.

Throughout the invention, the plural forms "a plurality of" and "the plurality of" do not exclude singular reference unless the context clearly dictates otherwise. For example, the term "a plurality of LED strings" or "the plurality of LED strings" may include only one LED string. For another example, the term "a plurality of LEDs" or "the plurality of LEDs" may include only one LED. In addition, throughout the invention, the meaning of "a," "an," and "the" may also include plural references.

FIG. 1 schematically illustrates an LED driving circuit 100 in accordance with an embodiment of the present invention. As shown in FIG. 1, the LED (Lighting Emitting Diode) driving circuit 100 is configured to drive an LED array ALED. The LED array ALED comprises a plurality of LED strings SLED1 . . . SLEDi . . . SLEDN, wherein i represents an integer in the range of 1 to N and N represents an integer greater than or equal to 1. And the LED string SLEDi comprises a plurality of LEDs LEDi1 . . . LEDij . . . LEDiM with each LED having a first terminal (e.g. anode) and a second terminal (e.g. cathode), wherein j represents an integer in the range of 1 to M and M represents an integer greater than or equal to 1. The first terminals of the LEDs LEDi2 . . . LEDiM are coupled to the second terminals of the LEDi1 . . . LEDi(M−1) in a one-to-one correspondence as shown, the first terminal of the LEDi1 is configured to receive a bias voltage VBIAS as an input power supply, and the second terminal of the LEDiM is configured to provide a headroom detecting voltage VLEDi. The LED driving circuit 100 is configured to regulate the LED current flowing through each LED string so as to keep the LED current in a desired value.

As shown in FIG. 1, the LED driving circuit 100 is configured to comprise a feedback control circuit 101 configured to generate a feedback control signal VFBO which is used for regulating the bias voltage VBIAS so that each of the plurality of headroom detecting voltages VLED1 . . . VLEDi . . . VLEDN is kept between a high headroom threshold voltage VTHH and a low headroom threshold voltage VTHL. In this way, in the LED driving circuit 100 of the present invention, on one hand, the LED current flowing through each LED string is regulated at a desired value because the bias voltage VBIAS is such regulated that each of the plurality of headroom detecting voltages VLED1 . . . VLEDi . . . VLEDN is higher than the low headroom threshold voltage VTHL, and on the other hand, the overall efficiency of the LED driving circuit 100 is maximized because the bias voltage VBIAS is such regulated that each of the plurality of headroom detecting voltages VLED1 . . . VLEDi . . . VLEDN is lower than the high headroom threshold voltage VTHH.

As shown in FIG. 1, the feedback control circuit 101 is configured to comprise a status detecting circuit 111, a counting circuit 112 and a modulating circuit 113. The status detecting circuit 111 is configured to receive the plurality of headroom detecting voltages VLED1 . . . VLEDi . . . VLEDN and to generate an up self-status signal UPS based on comparing each of the plurality of headroom detecting voltages VLED1 . . . VLEDi . . . VLEDN with the low headroom threshold voltage VTHL and a down self-status signal DOWNS based on comparing each of the plurality of headroom detecting voltages VLED1 . . . VLEDi . . . VLEDN with the high headroom threshold voltage VTHH.

The counting circuit 112 is coupled to the status detecting circuit 111 to receive the up self-status signal UPS and the down self-status signal DOWNS and is configured to generate a counting signal CT based on the up self-status signal UPS and the down self-status signal DOWNS. More specifically, the counting signal CT counts in a first direction or in a second direction opposite to the first direction or keeps unchanged based on the up self-status signal UPS and the down self-status signal DOWNS.

Persons of ordinary skill in the art will recognize that, in one embodiment, the first direction may be an up direction in which the counting signal CT counts up, while the second direction may be a down direction in which the counting signal CT counts down. Yet in another embodiment, the first direction may be a down direction in which the counting signal CT counts down, while the second direction may an up direction in which the counting signal CT counts up. Further in one embodiment, the counting signal CT may be a digital signal.

The modulating circuit 113 is coupled to the counting circuit 112 to receive the counting signal CT and is configured to generate a modulating signal MOD based on the counting signal CT, wherein the modulating signal MOD varies with the counting signal CT. More specifically, the modulating signal MOD increases, decreases or keeps unchanged based on the counting signal CT. In one embodiment, the modulating signal is a voltage signal.

The feedback control circuit 101 is configured to generate the feedback control signal VFBO based on the modulating signal MOD. Persons of ordinary skill in the art will recognize that, by stating "to generate the feedback control signal VFBO based on the modulating signal MOD", it may refer to the situation that the feedback control signal VFBO is generated by taking a further operation on the modulating signal MOD in one embodiment, like a buffering operation which will soon become apparent in the embodiment of FIG. 2, yet in another embodiment, it may refer to the situation that the feedback control signal VFBO is the modulating signal MOD itself without any further operation being taken on.

In operation, the up self-status signal UPS is in an active state (e.g. logic "1") when any of the headroom detecting voltages VLED1 . . . VLEDi . . . VLEDN is lower than the low headroom threshold voltage VTHL, the down self-status signal DOWNS is in an active state (e.g. logic "1") when each of the headroom detecting voltages VLED1 . . . VLEDi . . . VLEDN is higher than the high headroom threshold voltage VTHH, and the up self-status signal UPS is in a non-active state (e.g. logic "0") and the down self-status signal DOWNS is in a non-active state (e.g. logic "0") when each of the headroom detecting voltages VLED1 . . . VLEDi . . . VLEDN is between the low headroom threshold voltage VTHL and the high headroom threshold voltage VTHH. The counting signal CT counts in the first direction (e.g. an up direction) when the up self-status signal UPS is in the active state, the counting signal CT counts in the second direction (e.g. a down direction) when the down self-status signal DOWNS is in the active state, the counting signal CT keeps unchanged when the up self-status signal UPS is in the non-active state and the down self-status signal DOWNS is in the non-active state. The modulating signal MOD decreases when the counting signal CT counts in the first direction, the modulating signal MOD increases when the counting signal CT counts in the second direction, and the modulating signal MOD keeps unchanged when the counting signal CT keeps unchanged.

Figure 2:
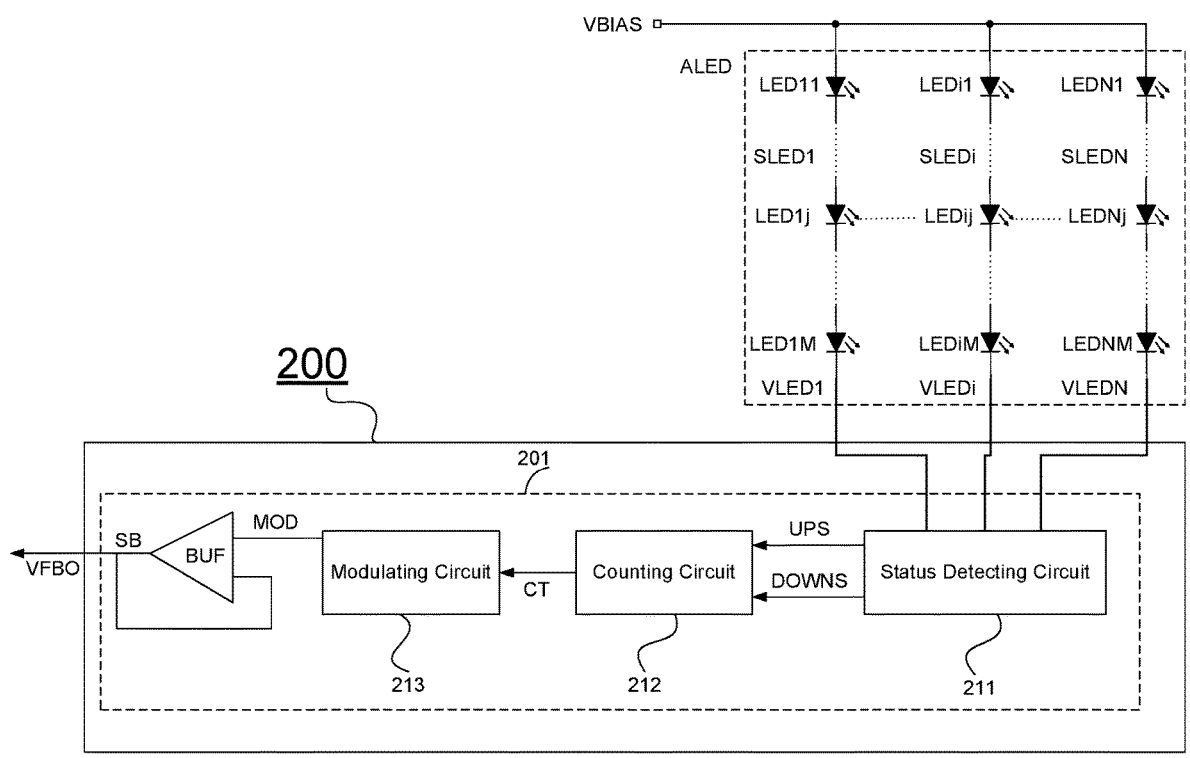
FIG. 2 schematically illustrates another feedback control circuit 201 in an LED driving circuit 200 in accordance with another embodiment of the present invention.

FIG. 2 schematically illustrates another feedback control circuit 201 in an LED driving circuit 200 in accordance with another embodiment of the present invention. As shown in FIG. 2, the feedback control circuit 201 differs from the feedback control circuit 101 in additionally comprising a buffer BUF. The buffer BUF has a first input terminal, a second input terminal and an output terminal, wherein the first input terminal is coupled to the modulating circuit 213 to receive the modulating signal MOD, and the output terminal is coupled to the second input terminal and is configured to provide a buffer signal SB based on the modulating signal MOD. In the embodiment as shown in FIG. 2, the buffer signal SB is output as the feedback control signal VFBO. Yet in another embodiment, the feedback control signal VFBO is generated by taking a further operation on the buffer signal SB. In one embodiment, the first input terminal is a non-inverting input terminal, and the second input terminal is an inverting input terminal.

Figure 3:
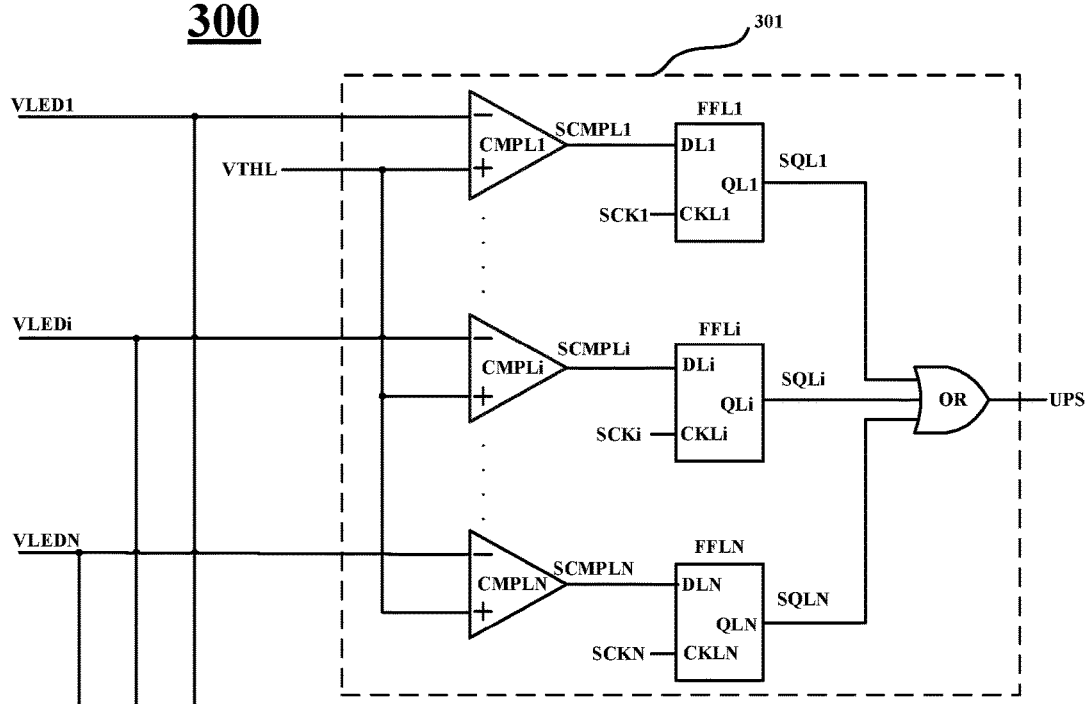
FIG. 3 schematically illustrates an exemplary status detecting circuit 300 in accordance with an embodiment of the present invention.
Figure 3:
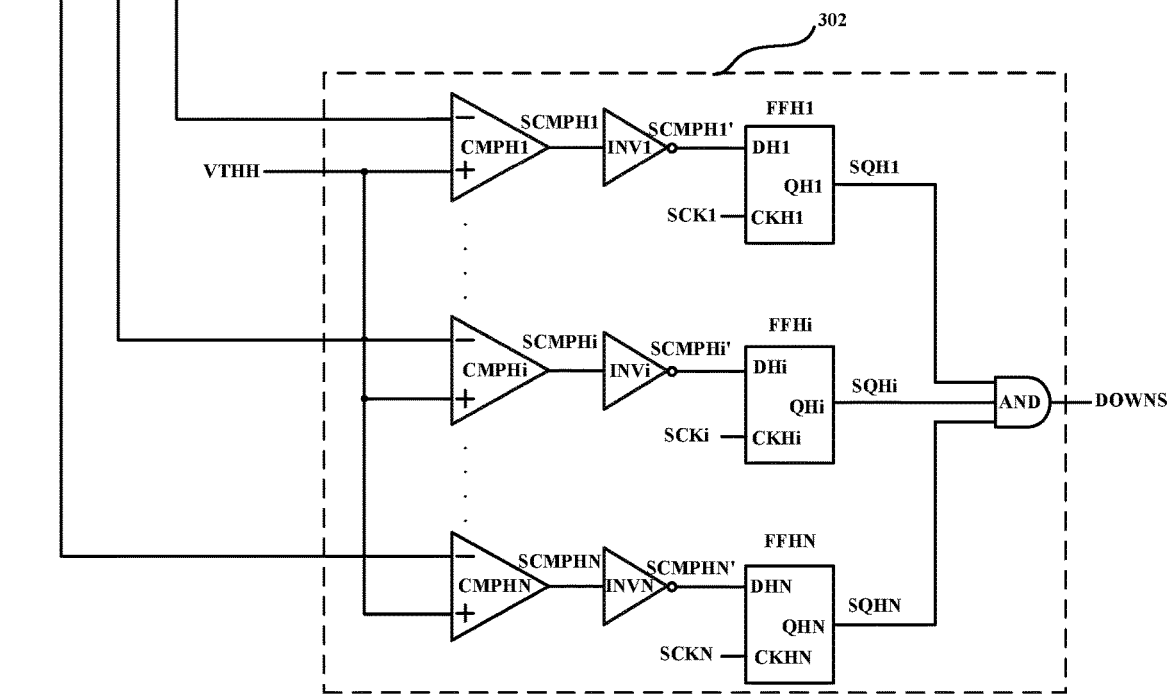

FIG. 3 schematically illustrates an exemplary status detecting circuit 300 in accordance with an embodiment of the present invention. As shown in FIG. 3, the status detecting circuit 300 is configured to comprise an up status detecting circuit 301 and a down status detecting circuit 302. The up status detecting circuit 301 is configured to receive the plurality of headroom detecting voltages VLED1 . . . VLEDi . . . VLEDN and the low headroom threshold voltage VTHL, and to generate an up self-status signal UPS by comparing the plurality of headroom detecting voltages VLED1 . . . VLEDi . . . VLEDN with the low headroom threshold voltage VTHL. More particularly, the up self-status signal UPS is in an active state (e.g. logic "1") when any of the plurality of headroom detecting voltages VLED1 . . . VLEDi . . . VLEDN is lower than the low headroom threshold voltage VTHL, and the up self-status signal UPS is in a non-active state (e.g. logic "0") when none of the plurality of headroom detecting voltages VLED1 . . . VLEDi . . . VLEDN is lower than the low headroom threshold voltage VTHL.

Further referring to FIG. 3, the up status detecting circuit 301 is configured to comprise a plurality of up comparators CMPL1 . . . CMPLi . . . CMPLN, a plurality of up flip-flops FFL1 . . . FFLi . . . FFLN, and an OR gate. The up comparator CMPLi has a first input terminal, a second input terminal and an output terminal, wherein the first input terminal is configured to receive the corresponding headroom detecting voltage VLEDi, the second input terminal is configured to receive the low headroom threshold voltage VTHL. In one embodiment, the first input terminal of the up comparator CMPLi is an inverting input terminal and the second input terminal of the up comparator CMPLi is a non-inverting input terminal. The up comparator CMPi compares the headroom detecting voltage VLEDi with the low headroom threshold voltage VTHL and generates an up comparison signal SCMPLi at the output terminal, wherein the up comparison signal SCMPLi is in an active state (e.g., logic "1") when the headroom detecting voltage VLEDi is lower than the low headroom threshold voltage VTHL, and the up comparison signal SCMPLi is in a non-active state (e.g., logic "0") when the headroom detecting voltage VLEDi is not lower than the low headroom threshold voltage VTHL.

The up flip-flop FFLi has a first input terminal DLi and an output terminal QLi, wherein the up flip-flop FFLi is configured to receive the corresponding up comparison signal SCMPLi at the first input terminal DLi and to generate an up flip-flop signal SQLi based on the up comparison signal SCMPLi. Further referring to FIG. 3, the up flip-flop FFLi may further comprise a second input terminal CKLi for receiving a clock signal SCKi. In operation, the up flip-flop FFLi samples the state of the up comparison signal SCMPLi when the clock signal SCKi is in an active state (e.g., transition from logic "1" to logic "0") and then holds the sampled state of the up comparison signal SCMPLi, the up flip-flop FFLi outputs the sampled and held state as the up flip-flop signal SQLi. Thus, the up flip-flop signal SQLi is in an active state (e.g., logic "1") when the sampled up comparison signal SCMPLi is in the active state, and in a non-active state (e.g., logic "0") when the sampled up comparison signal SCMPLi is in the non-active state. In one embodiment, the clock signal SCKi may be a pulse width modulation signal used for regulating the LED current flowing through the LED string LEDi to accomplish the PWM dimming function.

The OR gate has a plurality of input terminals in a one-to-one correspondence with the plurality of up flip-flops FFL1 . . . FFLi . . . FFLN and an output terminal. The OR gate is configured to receive the plurality of up flip-flop signals SQL1 . . . SQLi . . . SQLN generated by the plurality of up flip-flops FFL1 . . . FFLi . . . FFLN and to output the up self-status signal UPS at the output terminal based on the plurality of up flip-flop signals SQL1 . . . SQLi . . . SQLN. The OR gate generates the up self-status signal UPS by implementing a logical disjunction on the plurality of up flip-flop signals SQL1 . . . SQLi . . . SQLN. Thus, the up self-status signal UPS is in the active state when any of the plurality of up flip-flop signals SQL1 . . . SQLi . . . SQLN is in the active state, and in the non-active state when none of the plurality of up flip-flop signals SQL1 . . . SQLi . . . SQLN is in the active state.

Still referring to FIG. 3, the down status detecting circuit 302 is configured to receive the plurality of headroom detecting voltages VLED1 . . . VLEDi . . . VLEDN and the high headroom threshold voltage VTHH, and to generate a down self-status signal DOWNS by comparing the plurality of headroom detecting voltages VLED1 . . . VLEDi . . . VLEDN with the high headroom threshold voltage VTHH. More particularly, the down self-status signal DOWNS is in an active state (e.g., logic "0") when each of the plurality of headroom detecting voltages VLED1 . . . VLEDi . . . VLEDN is higher than the high headroom threshold voltage VTHH, and the down self-status signal DOWNS is in a non-active state (e.g., logic "1") when any of the plurality of headroom detecting voltages VLED1 . . . VLEDi . . . VLEDN is not higher than the high headroom threshold voltage VTHH.

Further referring to FIG. 3, the down status detecting circuit 302 is configured to comprise a plurality of down comparators CMPH1 ... CMPHi ... CMPHN, a plurality of inverters INV1 ... INVi ... INVN, a plurality of down flip-flops FFH1 ... FFHi ... FFHN, and an AND gate. The down comparator CMPHi has a first input terminal, a second input terminal and an output terminal, wherein the first input terminal is configured to receive the corresponding headroom detecting voltage VLEDi, the second input terminal is configured to receive the high headroom threshold voltage VTHH. In one embodiment, the first input terminal of the down comparator CMPHi is an inverting input terminal and the second input terminal of the down comparator CMPHi is a non-inverting input terminal. The down comparator CMPi compares the headroom detecting voltages VLEDi with the high headroom threshold voltage VTHH and generates a down comparison signal SCMPHi at the output terminal, wherein the down comparison signal SCMPHi is in an active state (e.g., logic "0") when the headroom detecting voltage VLEDi is higher than the high headroom threshold voltage VTHH, and in a non-active state (e.g., logic "1") when the headroom detecting voltage VLEDi is not higher than the high headroom threshold voltage VTHH.

The inverter INVi has an input terminal and an output terminal, wherein the inverter INVi is configured to receive the down comparison signal SCMPHi at the input terminal and to invert the down comparison signal SCMPHi so as to output an inverted down comparison signal SCMPHi' which is the inverted signal of the down comparison signal SCMPHi at the output terminal. The inverted down comparison signal SCMPHi' is in an active state (e.g., logic "1") when the down comparison signal SCMPHi is in the active state and the inverted down comparison signal SCMPHi' is in a non-active state (e.g., logic "0") when the down comparison signal SCMPHi is in the active state.

The down flip-flop FFHi has a first input terminal DHi and an output terminal QHi, wherein the down flip-flop FFHi is configured to receive the corresponding inverted down comparison signal SCMPHi' at the first input terminal DHi and to generate a down flip-flop signal SQHi based on the inverted down comparison signal SCMPHi'. Further referring to FIG. 3, the down flip-flop FFHi may further comprise a second input terminal CKHi for receiving the clock signal SCKi. In operation, the down flip-flop FFHi samples the state of the inverted down comparison signal SCMPHi' when the clock signal SCKi is in the active state and then holds the state of the inverted down comparison signal SCMPHi', the down flip-flop FFHi outputs the sampled and held state as the down flip-flop signal SQHi. Thus, the down flip-flop signal SQHi is in an active state when the sampled down comparison signal SCMPHi is in the active state, and in a non-active state when the sampled down comparison signal SCMPHi is in the non-active state.

The AND gate has a plurality of input terminals in a one-to-one correspondence with the plurality of down flip-flops FFH1 ... FFHi ... FFHN and an output terminal. The AND gate is configured to receive the plurality of down flip-flop signals SQH1 ... SQHi ... SQHN generated by the plurality of down flip-flops FFH1 ... FFHi ... FFHN and to output the down self-status signal DOWNS at the output terminal based on the plurality of down flip-flop signals SQH1 ... SQHi ... SQHN. The AND gate generates the down self-status signal DOWNS by implementing a logical conjunction on the plurality of down flip-flop signals SQH1 ... SQHi ... SQHN. Thus, the down self-status signal DOWNS is in the active state when all of the plurality of down flip-flop signals SQH1 ... SQHi ... SQHN are in their active states, and in the non-active state when any of the plurality of down flip-flop signals SQH1 ... SQHi ... SQHN is in the non-active state.

Persons of ordinary skill in the art will recognize that the status detecting circuit 300 is only for illustration and should not be construed as limiting the present invention in any manner, in another embodiment, the status detecting circuit 111 of FIG. 1 may be contemplated with a different configuration other than that shown in FIG. 3. For example, two pluralities of comparators are illustrated in FIG. 3 to respectively accomplish the foregoing up comparison functionality and the foregoing down comparison functionality, however, in another embodiment, only one plurality of comparators may be used to accomplish both the up comparison functionality and the down comparison functionality. In such the embodiment, each comparator may have a first input terminal, a second input terminal, a third input terminal and an output terminal. The first input terminal is configured to receive the corresponding headroom detecting voltage, the second input terminal is configured to receive the low headroom threshold voltage, and the third input terminal is configured to receive the high headroom threshold voltage. The comparator compares the corresponding headroom detecting voltage with the low headroom threshold voltage and the high headroom threshold voltage and generates a comparison signal accordingly. The comparison signal is then fed into the downstream components to respectively generate the up self-status signal UPS and the down self-status signal DOWNS.

Table 1 illustrates the operation of an exemplary counting circuit 112T in accordance with an embodiment of the present invention. The counting circuit 112T is configured to receive the up self-status signal UPS and the down self-status signal DOWNS. Based on the up self-status signal UPS and the down self-status signal DOWNS, the counting circuit 112T outputs a counting signal CT consisting of L sequential digital bits D[L-1] ... D[0] as shown in Table 1, wherein L is an integer greater than 0. More specifically, the counting circuit 112T increases one of the digital bits D[L-1] ... D[0] depending on its present state when the up self-status signal UPS is in the active state (e.g., logic "1"). In contrast, the counting circuit 112T decreases one of the digital bits D[L-1] ... D[0] depending on its present state when the down self-status signal DOWNS is in the active state (e.g., logic "1"). And the counting circuit 112T maintains the digital bits D[L-1] ... D[0] when both the up self-status signal UPS and the down self-status signal DOWNS are respectively in their non-active states (e.g., logic "0"). Taking L=8 for example, as shown in Table 1, the counting circuit 112T has 256 states S1 ... S256. Supposing the counting circuit 112T is currently in state S2 in which the counting signal CT is 00000001, the counting signal CT will increase to 00000010 when the up self-status signal UPS is in the active state, the counting signal CT will decrease to 00000000 when the down self-status signal DOWNS is in the active state, and the counting signal CT will maintain at 00000001 when both the up self-status signal UPS and the down self-status signal DOWNS are respectively in their non-active states. In addition, the counting circuit 112T may be further configured to receive a counting clock signal, and during an active state of the counting clock signal (e.g. transition from logic "0" to logic "1"), the counting circuit 112T increases one of the digital bits D[L-1] ... D[0] when the up self-status signal UPS is in the active state (e.g., logic "1"), and the counting circuit 112T decreases one of the digital bits D[L-1] ... D[0] when the down self-status signal DOWNS is in the active state (e.g., logic "1").

TABLE 1

| State | D[L-1] | D[6] | D[5] | ... | ... | D[2] | D[1] | D[0] |
|---|---|---|---|---|---|---|---|---|
| S1 | 0 | 0 | 0 | 0 | 0 | 0 | 0 | 0 |
| S2 | 0 | 0 | 0 | 0 | 0 | 0 | 0 | 1 |
| S3 | 0 | 0 | 0 | 0 | 0 | 0 | 1 | 0 |
| ... | ... | ... | ... | ... | ... | ... | ... | ... |
| S255 | 0 | 1 | 1 | 1 | 1 | 1 | 1 | 1 |
| S256 | 1 | 1 | 1 | 1 | 1 | 1 | 1 | 1 |

Figure 4:
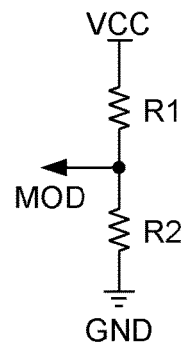
FIG. 4 schematically illustrates an exemplary modulating circuit 400 in accordance with an embodiment of the present invention.

FIG. 4 schematically illustrates an exemplary modulating circuit 400 in accordance with an embodiment of the present invention. As shown in FIG. 4, the modulating circuit 400 is configured to comprise a first resistor R1 and a second resistor R2. The first resistor R1 has a first terminal and a second terminal, wherein the first terminal is configured to receive a supply voltage VCC. In one embodiment, the supply voltage VCC may be the bias voltage VBIAS. The second resistor R2 has a first terminal and a second terminal, wherein the first terminal of the second resistor R2 is coupled to the second terminal of the first resistor R1 and is configured to generate the modulating signal MOD, the second terminal of the second resistor R2 is coupled to a reference ground GND. The second resistor R2 has a resistance and the resistance is controlled by the counting signal CT. In one embodiment, the resistance of the second resistor R2 decreases when the counting signal CT counts in the first direction, increases when the counting signal CT counts in the second direction, and keeps unchanged when the counting signal CT keeps unchanged. In one embodiment, the second resistor R2 may be implemented with a plurality of sub-resistors and a plurality of switches. The plurality of switches are controlled by the counting signal CT and are used to control the resistance of the second resistor R2 by enabling or disabling the sub-resistors.

Figure 5:
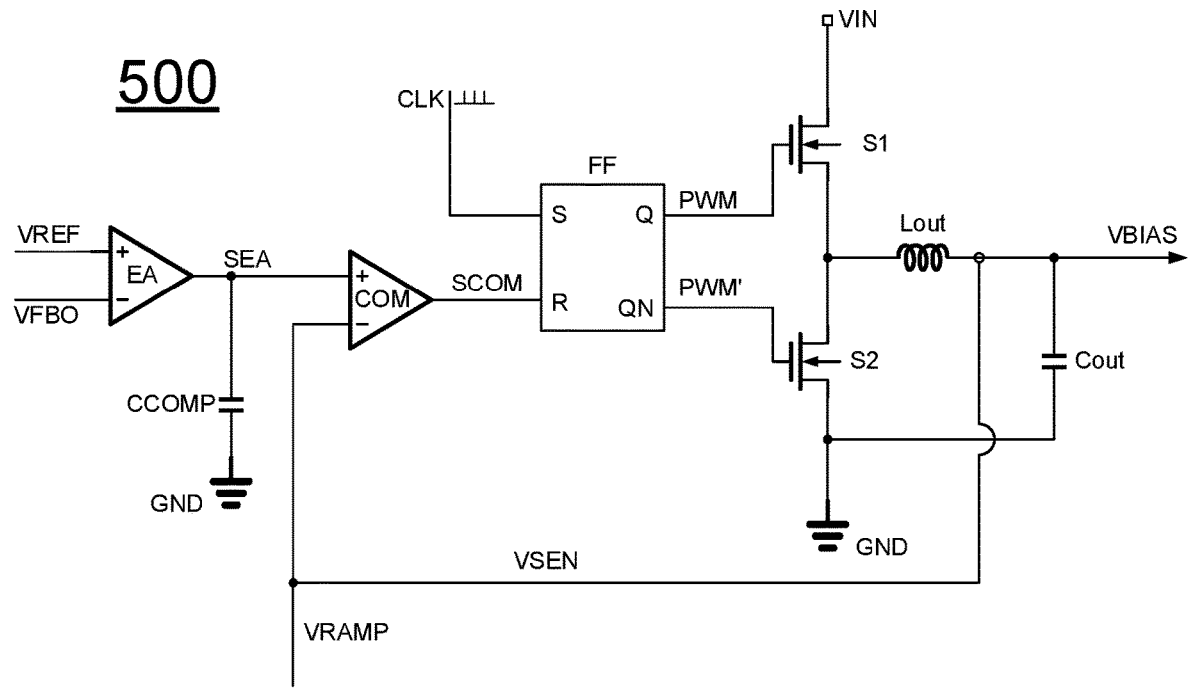
FIG. 5 schematically illustrates a voltage converter 500 in accordance with an embodiment of the present invention.

FIG. 5 schematically illustrates a voltage converter 500 in accordance with an embodiment of the present invention. The voltage converter 500 is configured to receive the feedback control signal VFBO and to generate the bias voltage VBIAS based on the feedback control signal VFBO. The voltage converter 500 comprises an output inductor Lout, an output capacitor Cout, a high side switch S1, a low side switch S2, an error amplifier EA, a comparator COM and an RS flip-flop FF. The high side switch S1 has a first terminal, a second terminal and a control terminal, wherein the first terminal is configured to receive an input voltage VIN. The low side switch S2 has a first terminal, a second terminal and a control terminal, wherein the first terminal of the low side switch S2 is coupled to the second terminal of the high side switch S1, and the second terminal of the low side switch S2 is coupled to a reference ground GND. The output inductor Lout has a first terminal and a second terminal, wherein the first terminal of the output inductor Lout is coupled to the second terminal of the first switch S1 and the first terminal of the second switch S2. The output capacitor Cout has a first terminal and a second terminal, wherein the first terminal of the output capacitor Cout is coupled the second terminal of the output inductor Lout and the second terminal of the output capacitor Cout is coupled to the reference ground GND.

The error amplifier EA has a first input terminal, a second input terminal and an output terminal, wherein the first input terminal is configured to receive the feedback control signal VFBO, the second input terminal is configured to receive a reference signal VREF. In one embodiment, the first input terminal of the error amplifier EA is an inverting input terminal and the second input terminal of the error amplifier EA is a non-inverting input terminal. The error amplifier EA is configured to reduce the difference between the reference signal VREF and the feedback control signal VFBO and to generate an error signal SEA at the output terminal. More specifically, an integrative signal is generated in the error amplifier EA based on an integration of the difference between the reference signal VREF and the feedback control signal VFB. The integrative signal in the example of FIG. 5 is a current which flows into a compensation capacitor CCOMP coupled between the output terminal of the error amplifier EA and the reference ground GND, and the current flowing into the compensation capacitor CCOMP generating the error signal SEA.

The comparator COM has a first input terminal, a second input terminal and an output terminal, wherein the first input terminal is configured to receive the error signal SEA, the second input terminal is configured to receive a sum value of a current sensing signal Vsen representing the current flowing through the output inductor Lout, the high side switch S1 or the low side switch S2 and a ramp signal VRAMP. The comparator COM compares the error signal SEA with the sum value of the current sensing signal Vsen and the ramp signal RAMP and generates a comparison signal SCOM accordingly. In one embodiment, the first input terminal of the comparator COM is a non-inverting input terminal and the second input terminal of the comparator COM is an inverting input terminal.

The RS flip-flop FF has a set terminal S, a reset terminal R, a first output terminal Q and a second output terminal QN, wherein the set terminal S of the RS flip-flop FF receives a voltage converting clock signal CLK, and the reset terminal R is coupled to the output terminal of the comparator COM to receive the comparison signal SCOM. The RS flip-flop FF generates a first pulse width modulation signal PWM at the first output terminal Q and a second pulse width modulation signal PWM' at the second output terminal QN of the RS flip-flop FF. The first output terminal Q is electrically coupled to the control terminal of the high side switch S1 and the first pulse width modulation signal PWM is configured to control the on and off of the high side switch S1, and the second output terminal QN is electrically coupled to the control terminal of the low side switch S2 and the second pulse width modulation signal PWM' is configured to control the on and off of the low side switch S2.

In one embodiment, the voltage converter is integrated in a first integrated chip, while the feedback control circuit of the present invention is integrated in a second integrated chip. The feedback control signal VFBO is provided from the second integrated chip to the first integrated chip to regulate the bias voltage which is provided to an LED array driving by an LED driving circuit comprising the feedback control circuit as an input power supply.

Person of ordinary skill in the art will recognize that, although a buck converter and a peak current control mode and the pulse width modulation is used as an example in FIG. 5, other voltage converting topologies and/or control modes may be also applied together with the feedback control circuit of the present invention. In these embodiments, the voltage converter is configured to comprise an error amplifier having a first input terminal, a second input terminal and an output terminal, wherein the first input terminal is configured to receive the feedback control signal VFBO, the second input terminal is configured to receive a reference signal VREF. The error amplifier is configured to reduce the difference between the reference signal VREF and the feedback control signal VFBO and to generate an error signal SEA at the output terminal. The error amplifier may operate to integrate the difference between the reference signal VREF and the feedback control signal VFBO and to thus generate a current which flows into a compensation capacitor to generate the error signal SEA. The voltage converter regulates the bias voltage VBIAS based on the error signal SEA.

Next, the overall operation of a feedback control circuit implemented with the status detecting circuit 300 of FIG. 3, the digital counting circuit 112T, the modulating circuit 400 of FIG. 4 and the buffer BUF of FIG. 2 and implemented in the environment of the voltage regulator 500 of FIG. 5 will now be set forth. As described in regard to the status detecting circuit 300 of FIG. 3, the modulating circuit 400 of FIG. 4 and the digital counting circuit 112T, when any of the plurality of headroom detecting voltages VLED1 . . . VLEDi . . . VLEDN is lower than the low headroom threshold voltage VTHL, the up self-status signal UPS is in the active state, which makes the digital counting circuit 112T increase the digital bits D[M−1] . . . D[0]. Such increase in turn decreases the resistance of the resistor R2, which thereby decreases the modulating signal MOD as well. And via the buffer BUF, the feedback control signal VFBO also decreases with the decrease of the modulating signal MOD. The feedback control signal VFBO is fed into the voltage regulator 500 to regulate the bias voltage VBIAS and thus the bias voltage VBIAS increases accordingly. With the increased bias voltage VBIAS, if any of the plurality of headroom detecting voltages VLED1 . . . VLEDi . . . VLEDN is still lower than the low headroom threshold voltage VTHL, the operation of decreasing the feedback control signal VFBO repeats. Otherwise, such operation stops if none of the plurality of headroom detecting voltages VLED1 . . . VLEDi . . . VLEDN are lower than the low headroom threshold voltage VTHL.

In contrast, when each of the plurality of headroom detecting voltages VLED1 . . . VLEDi . . . VLEDN is higher than the high headroom threshold voltage VTHH, the down self-status signal DOWNS is in the active state, which makes the digital counting circuit 112T decrease the digital bits D[M−1] . . . D[0]. Such decrease in turn increases the resistance of the resistor R2, which thereby increases the modulating signal MOD as well. And via the buffer BUF, the feedback control signal VFBO also increases with the increase of the modulating signal MOD. The feedback control signal VFBO is fed into the voltage regulator 500 to regulate the bias voltage VBIAS and thus the bias voltage VBIAS decreases accordingly. With the decreased bias voltage VBIAS, if each of the plurality of headroom detecting voltages VLED1 . . . VLEDi . . . VLEDN is still higher than the high headroom threshold voltage VTHH, the operation of increasing the feedback control signal VFBO repeats. Otherwise, such operation stops if any of the plurality of headroom detecting voltages VLED1 . . . VLEDi . . . VLEDN is lower than the high headroom threshold voltage VTHH.

When each of the plurality of headroom detecting voltages VLED1 . . . VLEDi . . . VLEDN is between the low headroom threshold voltage VTHL and the high headroom threshold voltage VTHH, both the up self-status signal UPS and the down self-status signal DOWNS are in their non-active states, the digital counting circuit 112T keeps unchanged, and so as the modulating signal MOD as well as the feedback control signal VFBO and the bias voltage VBIAS.

Figure 6:
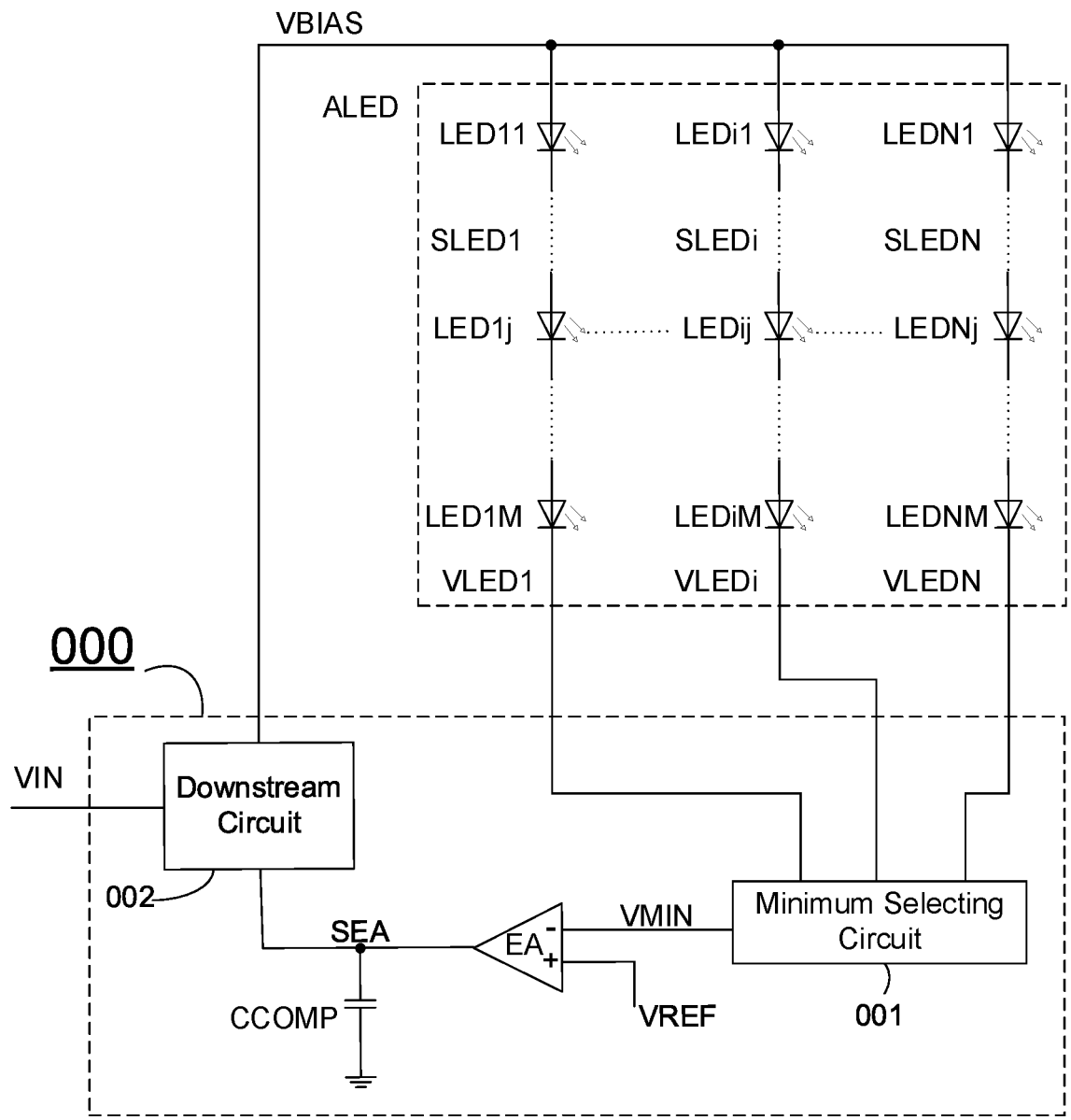
FIG. 6 schematically illustrates an LED driving circuit 000 with a traditional feedback control scheme.

FIG. 6 schematically illustrates an LED driving circuit 000 with a traditional feedback control scheme. As shown in FIG. 6, the LED driving circuit 000 supplies a bias voltage VBIAS to a plurality of LED strings SLEDI . . . SLEDi . . . SLEDN and the plurality of LED strings SLED1 . . . SLEDi . . . SLEDN provide a plurality of headroom detecting voltages VLED1 . . . VLEDi . . . VLEDN. The driving circuit 000 comprises a minimum selecting circuit 001, an error amplifier EA, and a downstream circuit 002. The minimum selecting circuit 001 selects and outputs the minimum one of the plurality of headroom detecting voltages VLED1 . . . VLEDi . . . VLEDN which is denoted as VMIN in FIG. 6. The error amplifier EA is configured to reduce the difference between a reference signal VREF and the minimum headroom detecting voltage VMIN. In use, the error amplifier EA is configured to generate a current flowing through the compensation capacitor CCOMP which thereby generates an error signal SEA. The error signal SEA is provided to the downstream circuit 002 to be further processed so as to regulate the bias voltage VBIAS at a desired value representing by the reference voltage VREF.

In comparison with the prior art feedback control scheme shown in FIG. 6, the feedback control circuit of the present invention directly adjusts the feedback control signal VFBO other than adjusting the error signal SEA, which makes the feedback control circuit of the present invention have better performance. In addition, in the embodiment where the voltage converter is integrated in one integrated chip, while the feedback control circuit of the present invention is integrated in another integrated chip, as for a typical integrated chip comprising the voltage converter, it usually comprises an external feedback pin for externally receiving a feedback signal representing the bias voltage VBIAS, and rarely comprises an external compensation pin for externally receiving an error signal SEA from an error amplifier, the feedback control circuit of the present invention will be more universal for the integrated chips comprising the voltage converter. Moreover, in the prior art feedback control scheme, the minimum one of the plurality of headroom detecting voltage is used for regulation, while in the present invention, every headroom detecting voltage is compared with the low headroom threshold voltage and the high headroom threshold voltage, which makes the LED driving circuit have a more accurate regulation and a higher overall efficiency.

Figure 7:
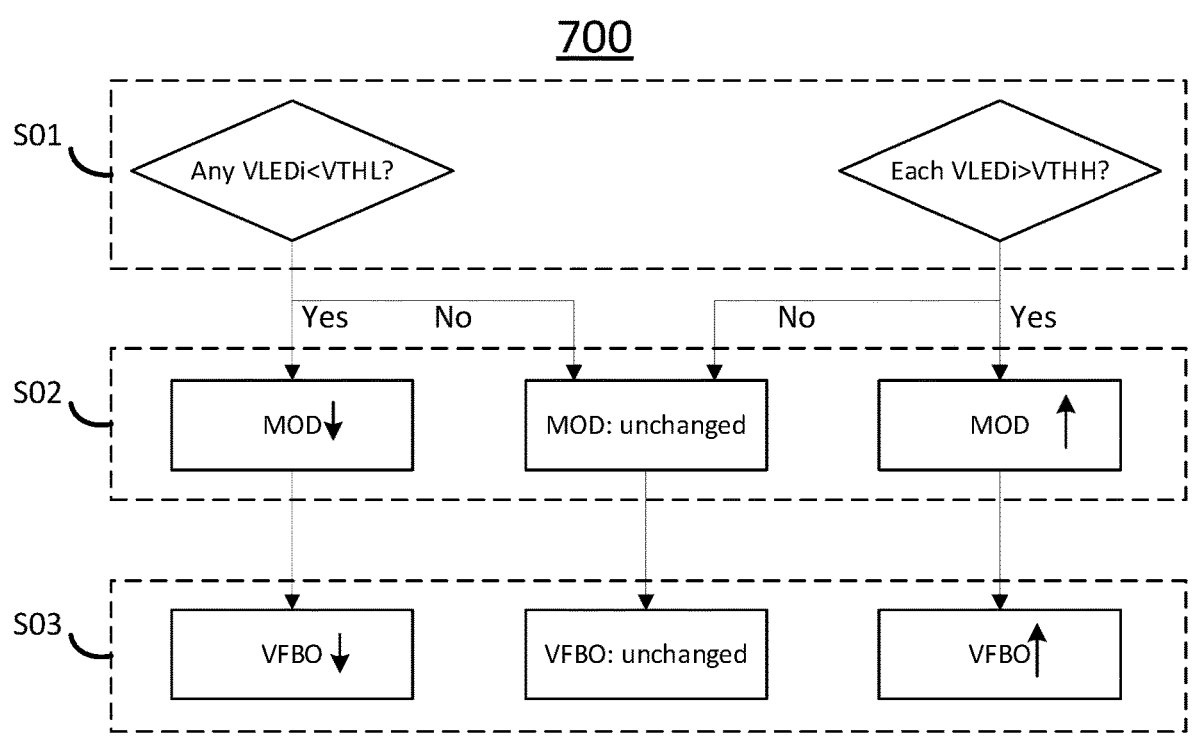
FIG. 7 illustrates a method 700 for generating a feedback control signal VFBO in accordance with an embodiment of the present invention.

FIG. 7 illustrates a method 700 for generating a feedback control signal VFBO in accordance with an embodiment of the present invention. The feedback control signal VFBO is used for regulating a bias voltage VBIAS which is used for supplying a plurality of LED strings SLED1 . . . SLEDi . . . SLEDN, wherein i represents an integer in the range of 1 to N and N represents an integer greater than or equal to 1. Each LED string SLEDi has a first terminal and a second terminal, wherein the plurality of LED strings SLED1 . . . SLEDi . . . SLEDN receive the bias voltage VBIAS at their first terminals, and the plurality of LED strings SLED1 . . . SLEDi . . . SLEDN provide a plurality of headroom detecting voltages VLED1 . . . VLEDi . . . VLEDN at the second terminals with the headroom detecting voltage VLEDi corresponding to the LED string SLEDi.

Referring to FIG. 7, the method 700 comprises steps S01, S02 and S03. In step S01, each of the plurality of headroom detecting voltages VLED1 . . . VLEDi . . . VLEDN is compared with a high headroom threshold voltage VTHH and also a low headroom threshold voltage VTHL.

In step S02, a modulating signal MOD is generated based on the comparison between each headroom detecting voltage and the high headroom threshold voltage VTHH and the comparison between each headroom detecting voltage and the low headroom threshold voltage VTHL in step S01.

More specifically, the modulating signal MOD decreases when any of the headroom detecting voltages VLED1 . . . VLEDi . . . VLEDN is lower than the low headroom threshold voltage VTHL, the modulating signal MOD increases when each of the headroom detecting voltages VLED1 . . . VLEDi . . . VLEDN is higher than the high headroom threshold voltage VTHH, and the modulating signal MOD keeps unchanged when each of the headroom detecting voltages VLED1 . . . VLEDi . . . VLEDN is between the low headroom threshold voltage VTHL and the high headroom threshold voltage VTHH.

In step S03, the feedback control signal VFBO is generated based on the modulating signal MOD. More specifically, the feedback control signal VFBO decreases when the modulating signal MOD decreases, the feedback control signal VFBO increases when the modulating signal MOD increases, and the feedback control signal VFBO keeps unchanged when the modulating signal MOD keeps unchanged. Persons of ordinary skill in the art will recognize that, in one embodiment, the feedback control signal VFBO may be generated by taking a further operation on the modulating signal MOD, yet in another embodiment, the feedback control signal VFBO is the modulating signal MOD itself without any further operation being taken on. The feedback control signal VFBO is used for regulating the bias voltage VBIAS so that each of the headroom detecting voltages VLED1 . . . VLEDi . . . VLEDN is between the high headroom threshold voltage VTHH and the low headroom threshold voltage VTHL.

Figure 8:
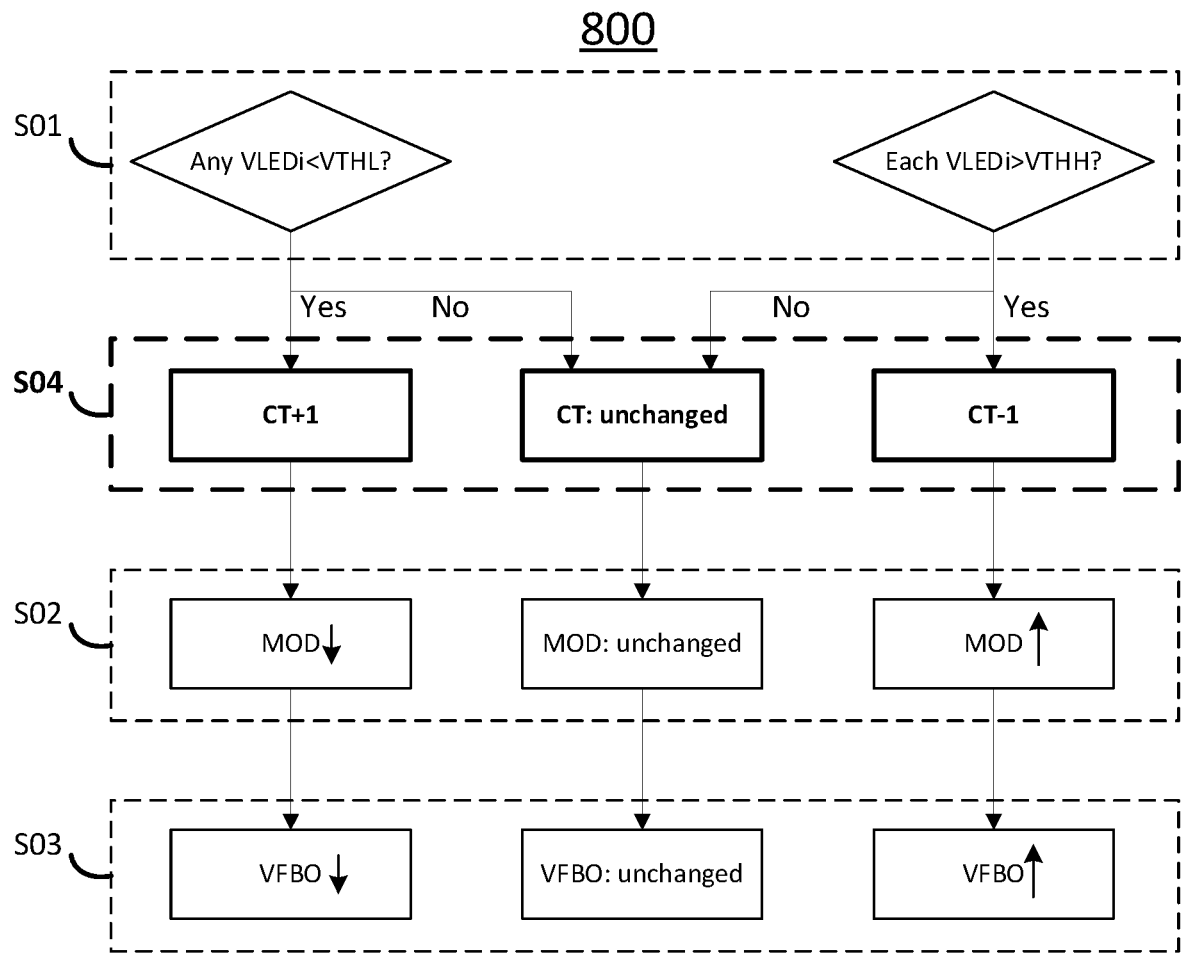
FIG. 8 illustrates a method 800 for generating a feedback control signal VFBO in accordance with another embodiment of the present invention.

FIG. 8 illustrates a method 800 for generating a feedback control signal VFBO in accordance with another embodiment of the present invention. The method 800 differs from the method 700 in comprising an additional step S04 performed between the step S01 and the step S02.

In step S04, a counting signal CT is generated based on the comparison between each headroom detecting voltage and the high headroom threshold voltage VTHH and the comparison between each headroom detecting voltage and the low headroom threshold voltage VTHL in step S01. More specifically, the counting signal CT counts in a first direction when any of the headroom detecting voltages is lower than the low headroom threshold voltage VTHL, the counting signal CT counts in a second direction opposite to the first direction when each of the headroom detecting voltages is higher than the high headroom threshold voltage VTHH, and the counting signal CT keeps unchanged when each of the headroom detecting voltages is between the low headroom threshold voltage VTHL and the high headroom threshold voltage VTHH.

And accordingly, in step S02, the modulating signal MOD is generated based on the counting signal CT. More specifically, the modulating signal MOD decreases when the counting signal CT counts in the first direction, the modulating signal MOD increases when the counting signal CT counts in the second direction, and the modulating signal MOD keeps unchanged when the counting signal CT keeps unchanged.

Persons of ordinary skill in the art will recognize that, as shown in the embodiment of FIG. 8, the first direction may be an up direction in which the counting signal CT counts up, while the second direction may a down direction in which the counting signal CT counts down. Yet in another embodiment, the first direction may be a down direction in which the counting signal CT counts down, while the second direction may an up direction in which the counting signal CT counts up.

Figure 9:
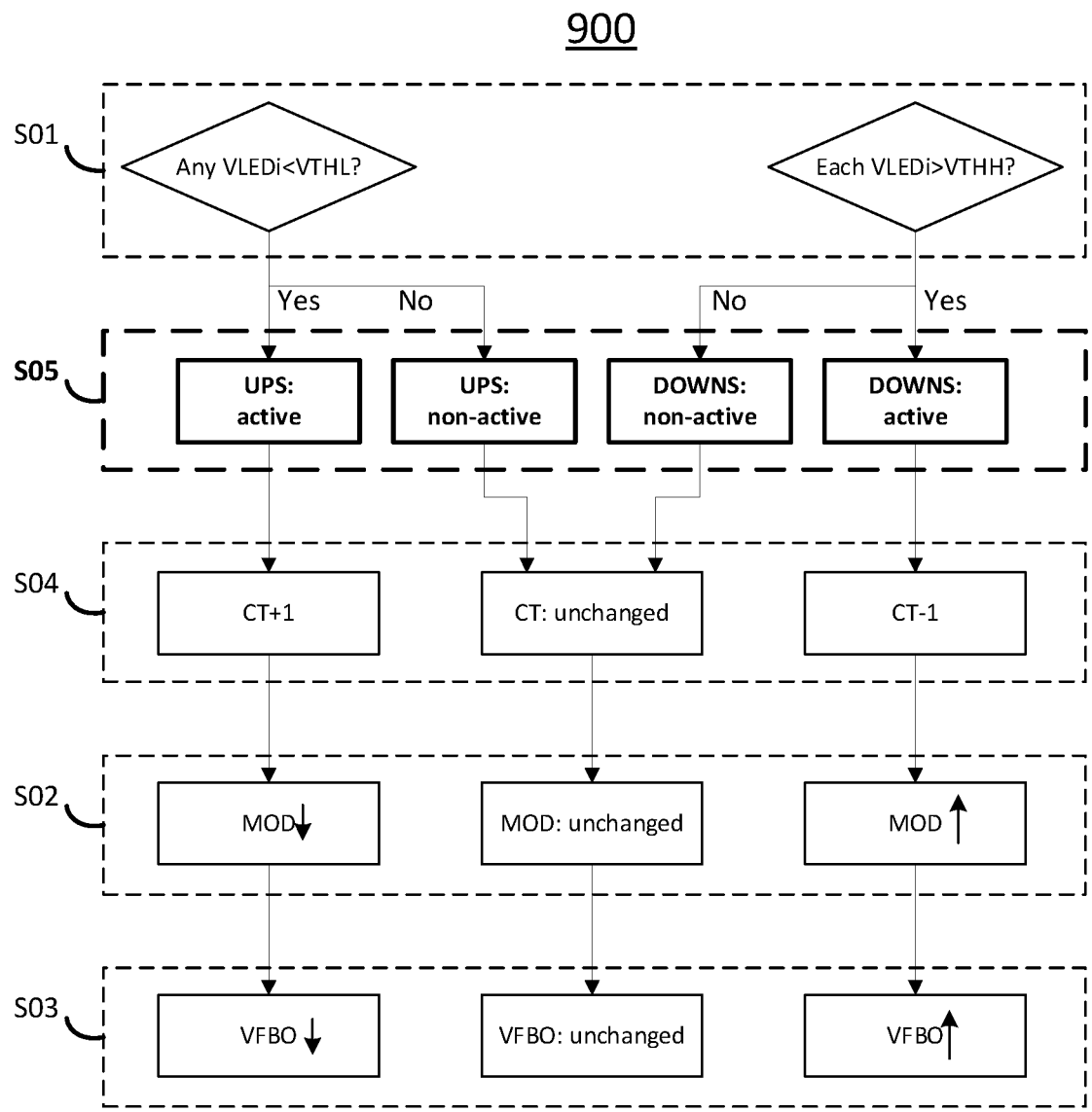
FIG. 9 illustrates a method 900 for generating a feedback control signal VFBO in accordance with another embodiment of the present invention.

FIG. 9 illustrates a method 900 for generating a feedback control signal VFBO in accordance with another embodiment of the present invention. The method 900 differs from the method 800 in comprising an additional step S05 performed between the step S01 and the step S04.

In step S05, an up self-status signal UPS is generated based on comparing each headroom detecting voltage with the low headroom threshold voltage VTHL and a down self-status signal DOWNS based on comparing each headroom detecting voltage with the high headroom threshold voltage VTHH. More specifically, the up self-status signal UPS is in an active state (e.g., logic "1") when any of the headroom detecting voltages is lower than the low headroom threshold voltage VTHL, the down self-status signal DOWNS is in an active state (e.g., logic "0") when each of the headroom detecting voltages is higher than the high headroom threshold voltage VTHH, and the up self-status signal UPS is in a non-active state (e.g., logic "0") and the down self-status signal DOWNS is in a non-active state (e.g., logic "1") when each of the headroom detecting voltages is between the low headroom threshold voltage VTHL and the high headroom threshold voltage VTHH.

And accordingly, in step S04, the counting signal CT counts in the first direction when the up self-status signal UPS is in the active state, the counting signal CT counts in the second direction when the down self-status signal DOWNS is in the active state, and the counting signal CT keeps unchanged when both the up self-status signal UPS is in the non-active state and the down self-status signal DOWNS is in the non-active state.

Figure 10:
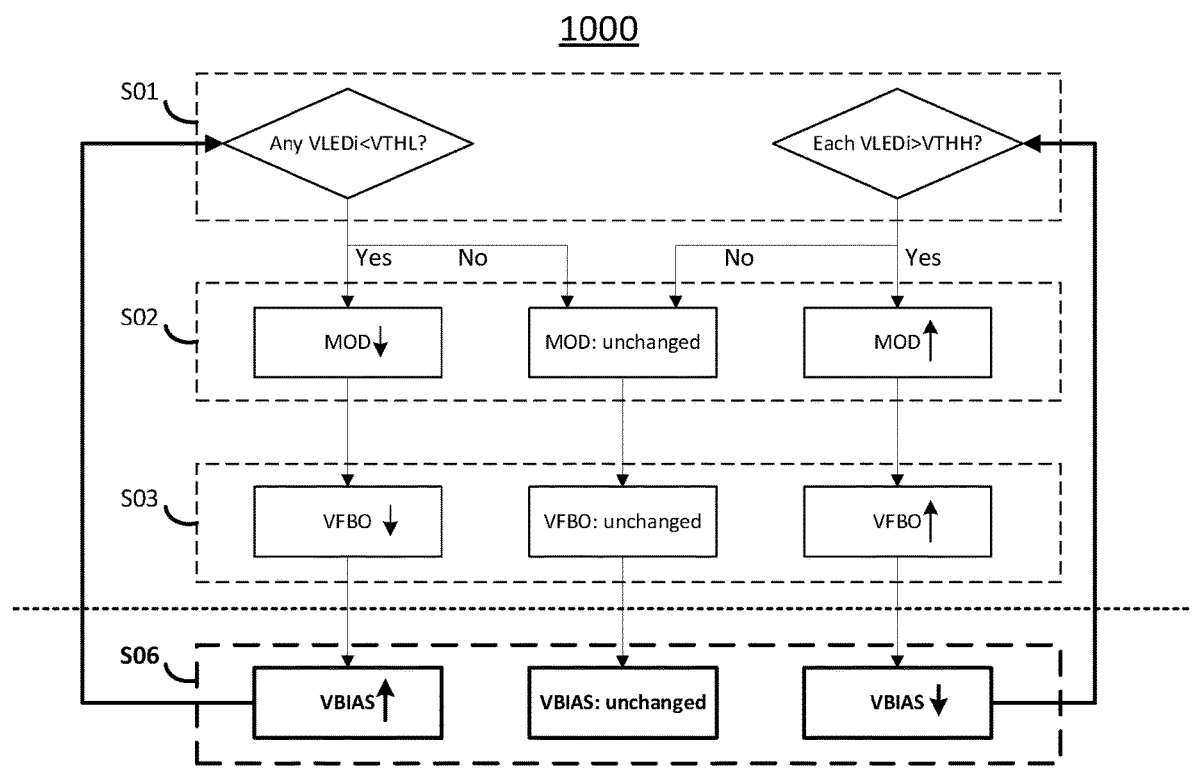
FIG. 10 illustrates the regulation of the bias voltage VBIAS with the method 700 of FIG. 7.

FIG. 10 illustrates the regulation of the bias voltage VBIAS with the method 700 of FIG. 7. As shown in FIG. 10, in a step S06, the bias voltage VBIAS is generated based on the feedback control signal VFBO. More specifically, the bias voltage VBIAS increases when the feedback control signal VFBO decreases, the bias voltage VBIAS decreases when the feedback control signal VFBO increases, and the bias voltage VBIAS keeps unchanged when the feedback control signal VFBO keeps unchanged. After step S06 is performed, another cycle repeats to restart from step S01.

Figure 11:
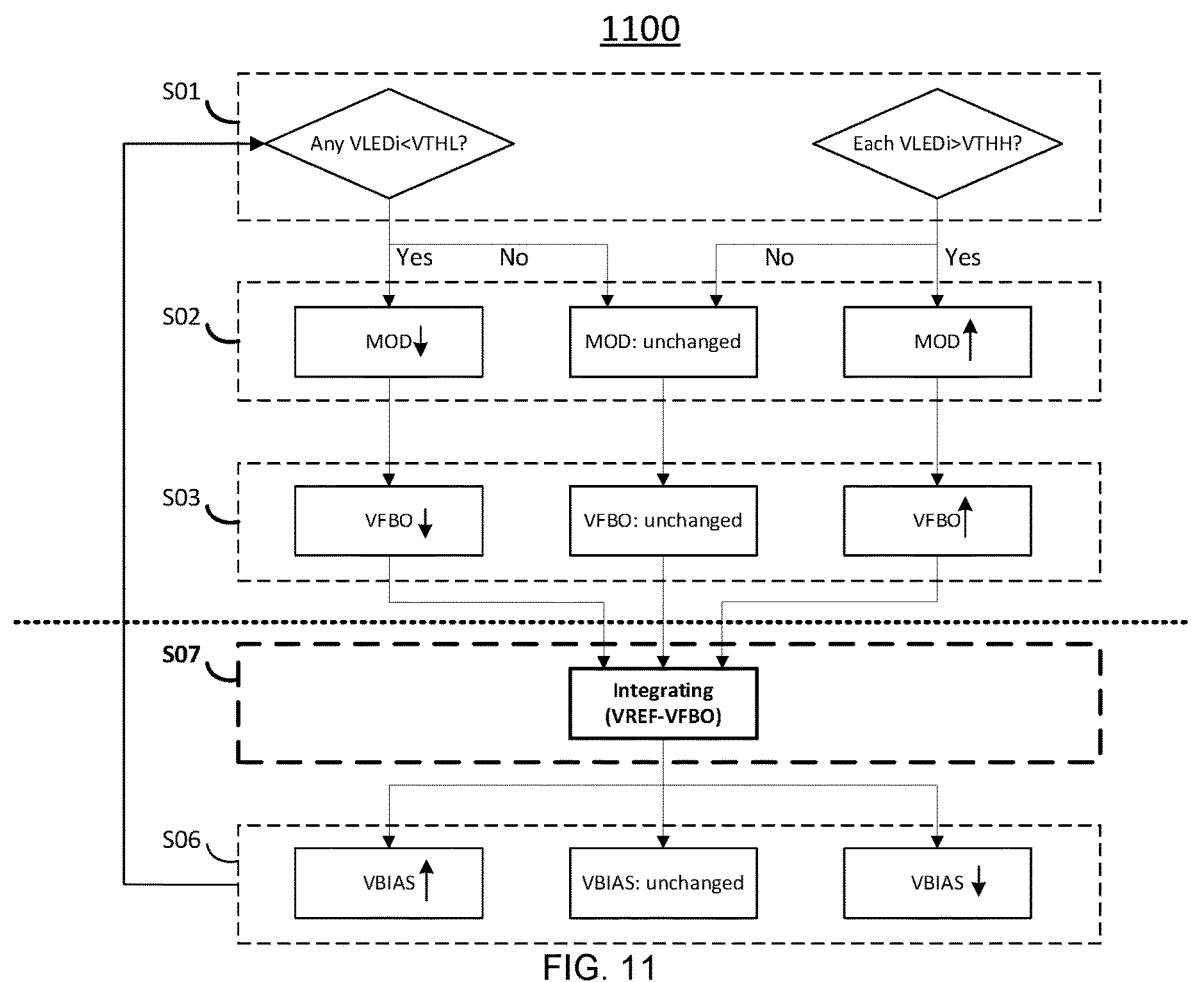
FIG. 11 illustrates the regulation of the bias voltage VBIAS with the method 700 of FIG. 7 with an additional step S07.

FIG. 11 illustrates the regulation of the bias voltage VBIAS with the method 700 of FIG. 7 with an additional step S07. As shown in FIG. 11, in step S07, it is performed to integrate the difference between a reference signal VREF and the feedback control signal VFBO. And accordingly in step S06, the bias voltage VBIAS is regulated by the integration result. In one embodiment, the integration may be achieved with an error amplifier.

Persons of ordinary skill in the art will recognize that, in one embodiment, the steps S01-S03 of the method 700 may be performed in one IC chip, yet the steps S06 and/or S07 may be performed in another separate integrated chip. Yet in another embodiment, all the steps S01-S03, S06 and S07 may be performed in one integrated chip.

Persons of ordinary skill in the art will also recognize that, although the step S06 is illustrated to be used together with the method 700 in FIG. 10 and the step S07 is illustrated to be used together with the method 700 in FIG. 11, the steps S06 and S07 may be also used together with the method 800 and/or 900.

It will be appreciated by persons skilled in the art that the present invention is not limited to what has been particularly shown and described herein above. Rather the scope of the present invention is defined by the appended claims and includes both combinations and sub-combinations of the various features described hereinabove as well as variations and modifications thereof which would occur to persons skilled in the art upon reading the foregoing description and which are not in the prior art.

What is claimed is:

1. A feedback control circuit used in an LED (Light Emitting Diode) driving circuit driving a plurality of LED strings, wherein each LED string has a first terminal and a second terminal, and the plurality of LED strings receive a bias voltage at the first terminals and provide at the second terminals a plurality of headroom detecting voltages having a one-to-one correspondence with the second terminals of the plurality of LED strings, the feedback control circuit comprising:
a status detecting circuit configured to receive the plurality of headroom detecting voltages and to generate an up self-status signal based on comparing each headroom detecting voltage with a low headroom threshold voltage and a down self-status signal based on comparing each headroom detecting voltage with a high headroom threshold voltage;
a counting circuit configured to generate a counting signal counting in a first direction or in a second direction opposite to the first direction or keeping unchanged based on the up self-status signal and the down self-status signal; and
a modulating circuit configured to generate a modulating signal varying with the counting signal;
wherein the feedback control circuit is configured to generate a feedback control signal based on the modulating signal and wherein the feedback control signal is used for regulating the bias voltage so that each of the plurality of headroom detecting voltages is between the high headroom threshold voltage and the low headroom threshold voltage.

2. The feedback control circuit of claim 1, wherein
the up self-status signal is in an active state when any of the plurality of headroom detecting voltages is lower than the low headroom threshold voltage, the down self-status signal is in an active state when each of the plurality of headroom detecting voltages is higher than the high headroom threshold voltage, and the up self-status signal is in a non-active state and the down self-status signal is in a non-active state when each of the plurality of headroom detecting voltages is between the low headroom threshold voltage and the high headroom threshold voltage;
the counting signal counts in the first direction when the up self-status signal is in the active state, the counting signal counts in the second direction when the down self-status signal is in the active state, and the counting signal keeps unchanged when the up self-status signal is in the non-active state and the down self-status signal is in the non-active state; and
the modulating signal decreases when the counting signal counts in the first direction, the modulating signal increases when the counting signal counts in the second direction, and the modulating signal keeps unchanged when the counting signal keeps unchanged.

3. The feedback control circuit of claim 2, wherein the counting signal counts up in the first direction and counts down in the second direction.

4. The feedback control circuit of claim 1, wherein the feedback control circuit further comprises a buffer having a first input terminal, a second input terminal and an output terminal, the first input terminal is coupled to the modulating circuit to receive the modulating signal, and the output terminal is coupled to the second input terminal and is configured to provide a buffer signal, and wherein the feedback control signal is generated based on the buffer signal.

5. The feedback control circuit of claim 1, wherein the status detecting circuit comprises:
a plurality of up comparators in a one-to-one correspondence with the plurality of headroom detecting voltages, wherein each up comparator is configured to receive the corresponding headroom detecting voltage and the low headroom threshold voltage and to generate an up comparison signal by comparing the headroom detecting voltage with the low headroom threshold voltage;
a plurality of up flip-flops in a one-to-one correspondence with the plurality of up comparators, wherein each up flip-flop is coupled to the corresponding up comparator to receive the corresponding up comparison signal and is configured to generate an up flip-flop signal based on the up comparison signal;
an OR gate coupled to the plurality of up flip-flops to receive the plurality of up flip-flop signals generated by the plurality of up flip-flops and configured to generate an OR signal based on the plurality of up flip-flop signals;
a plurality of down comparators in a one-to-one correspondence with the plurality of headroom detecting voltages, wherein each down comparator is configured to receive the corresponding headroom detecting voltage and the high headroom threshold voltage and to generate a down comparison signal by comparing the headroom detecting voltage with the high headroom threshold voltage;
a plurality of inverters in a one-to-one correspondence with the plurality of down comparators, wherein each inverter is coupled to the corresponding down comparator to receive the corresponding down comparison signal and is configured to generate an inverted down comparison signal based on the down comparison signal;
a plurality of down flip-flops in a one-to-one correspondence with the plurality of inverters, wherein each down flip-flop is coupled to the corresponding inverter to receive the corresponding inverted down comparison signal and is configured to generate a down flip-flop signal based on the inverted down comparison signal; and
an AND gate coupled to the plurality of down flip-flops to receive the plurality of down flip-flop signals generated by the plurality of down flip-flops and configured to generate an AND signal based on the plurality of down flip-flop signals.

6. The feedback control circuit of claim 1, wherein the counting signal comprises a plurality of digital bits, and the counting signal increases one of the plurality of digital bits when the up self-status signal is in an active state, the counting signal decreases one of the plurality of digital bits when the down self-status signal is in an active state, and the counting signal maintains the digital bits when the up self-status signal is in a non-active state and the down self-status signal is in a non-active state.

7. The feedback control circuit of claim 1, wherein the modulating circuit comprises:
a first resistor having a first terminal and a second terminal, wherein the first terminal is configured to receive a supply voltage; and
a second resistor having a first terminal and a second terminal, wherein the first terminal of the second resistor is coupled to the second terminal of the first resistor and is configured to generate the modulating signal, and the second terminal of the second resistor is coupled to a reference ground, and wherein the second resistor has a resistance and the resistance is controlled by the counting signal.

8. The feedback control circuit of claim 1, wherein the feedback control circuit is coupled to an error amplifier, and wherein the error amplifier has a first input terminal, a second input terminal and an output terminal, the first input terminal is configured to receive the feedback control signal, the second input terminal is configured to receive a reference signal, the error amplifier is configured to reduce the difference between the reference signal and the feedback control signal and to generate an error signal at the output terminal for regulating the bias voltage.

9. A method for generating a feedback control signal for regulating a bias voltage used for supplying a plurality of LED strings, wherein each LED string has a first terminal and a second terminal, and the plurality of LED strings receive a bias voltage at the first terminals and provide at the second terminals a plurality of headroom detecting voltages having a one-to-one correspondence with the second terminals of the plurality of LED strings, the method comprising:
comparing each headroom detecting voltage with a high headroom threshold voltage and a low headroom threshold voltage;
generating a modulating signal based on the comparison between each headroom detecting voltage and the high headroom threshold voltage and the comparison between each headroom detecting voltage and the low headroom threshold voltage, wherein the modulating signal decreases when any of the plurality of headroom detecting voltages is lower than the low headroom threshold voltage, the modulating signal increases when each of the plurality of headroom detecting voltages is higher than the high headroom threshold voltage, and the modulating signal keeps unchanged when each of the plurality of headroom detecting voltages is between the low headroom threshold voltage and the high headroom threshold voltage; and
generating the feedback control signal based on the modulating signal, wherein the feedback control signal is used for regulating the bias voltage so that each of the plurality of headroom detecting voltages is between the high headroom threshold voltage and the low headroom threshold voltage.

10. The method of claim 9, wherein the method further comprises:
generating a counting signal based on the comparison between each headroom detecting voltage and the high headroom threshold voltage and the comparison between each headroom detecting voltage and the low headroom threshold voltage, and wherein the counting signal counts in a first direction when any of the plurality of headroom detecting voltages is lower than the low headroom threshold voltage, the counting signal counts in a second direction opposite to the first direction when each headroom detecting voltage is higher than the high headroom threshold voltage, and the counting signal keeps unchanged when each headroom detecting voltage is between the low headroom threshold voltage and the high headroom threshold voltage; and
generating the modulating signal based on the counting signal, wherein the modulating signal decreases when the counting signal counts in the first direction, the modulating signal increases when the counting signal counts in the second direction, and the modulating signal keeps unchanged when the counting signal keeps unchanged.

11. The method of claim 10,
wherein the method further comprises generating an up comparison signal based on comparing each headroom detecting voltage with a low headroom threshold voltage and a down comparison signal based on comparing each headroom detecting voltage with a high headroom threshold voltage, wherein the up comparison signal is in an active state when any of the plurality of headroom detecting voltages is lower than the low headroom threshold voltage, the down comparison signal is in an active state when each of the plurality of headroom detecting voltages is higher than the high headroom threshold voltage, and the up comparison signal is in a non-active state and the down comparison signal is in a non-active state when each of the plurality of headroom detecting voltages is between the low headroom threshold voltage and the high headroom threshold voltage; and
wherein the counting signal counts in the first direction when the up comparison signal is in the active state, the counting signal counts in the second direction when the down comparison signal is in the active state, the counting signal keeps unchanged when the up comparison signal is in the non-active state and the down comparison signal is in the non-active state.

12. The method of claim 10, wherein the counting signal counts up in the first direction and counts down in the second direction.

13. The method of claim 9, wherein the bias voltage is regulated by integrating the difference between a reference signal and the feedback control signal.

14. An LED driving system driving a plurality of LED strings, wherein each LED string has a first terminal and a second terminal, and the plurality of LED strings receive a bias voltage at the first terminals and provide at the second terminals a plurality of headroom detecting voltages having a one-to-one correspondence with the second terminals of the plurality of LED strings, the LED driving system comprising:
a feedback control circuit, comprising:
a status detecting circuit configured to receive the plurality of headroom detecting voltages and to generate an up self-status signal based on comparing each headroom detecting voltage with a low headroom threshold voltage and a down self-status signal based on comparing each headroom detecting voltage with a high headroom threshold voltage;
a counting circuit configured to generate a counting signal counting in a first direction or in a second direction opposite to the first direction or keeping unchanged based on the up self-status signal and the down self-status signal; and
a modulating circuit configured to generate a modulating signal varying with the counting signal;
wherein based on the modulating signal, the feedback control circuit is configured to generate a feedback control signal, and
a voltage converter coupled to the feedback control circuit to receive the feedback control signal and configured to generate and regulate the bias voltage based on the feedback control signal so that each of the plurality of headroom detecting voltages is between the high headroom threshold voltage and the low headroom threshold voltage.

15. The LED driving system of claim 14, wherein the voltage converter comprises an error amplifier, and wherein the error amplifier has a first input terminal, a second input terminal and an output terminal, the first input terminal is configured to receive the feedback control signal, the second input terminal is configured to receive a reference signal, the error amplifier is configured to reduce the difference between the reference signal and the feedback control signal and to generate an error signal at the output terminal, and wherein the voltage converter is configured to regulate the bias voltage based on the error signal.

16. The LED driving system of claim 14, wherein the feedback control circuit further comprises a buffer having a first input terminal, a second input terminal and an output terminal, the first input terminal is coupled to the modulating circuit to receive the modulating signal, and the output terminal is coupled to the second input terminal and is configured to provide a buffer signal, and wherein the feedback control signal is generated based on the buffer signal.

17. The LED driving system of claim 14, wherein the counting signal comprises a plurality of digital bits, and the counting signal increases a digital bit when the up self-status signal is in an active state, the counting signal decreases a digital bit when the down self-status signal is in an active state, and the counting signal maintains the digital bits when the up self-status signal is in a non-active state and the down self-status signal is in a non-active state.

18. The LED driving system of claim 14, wherein
a plurality of up comparators in a one-to-one correspondence with the plurality of headroom detecting voltages, wherein each up comparator is configured to receive the corresponding headroom detecting voltage and the low headroom threshold voltage and to generate an up comparison signal by comparing the headroom detecting voltage with the low headroom threshold voltage;
a plurality of up flip-flops in a one-to-one correspondence with the plurality of up comparators, wherein each up flip-flop is coupled to the corresponding up comparator to receive the corresponding up comparison signal and is configured to generate an up flip-flop signal based on the up comparison signal;
an OR gate coupled to the plurality of up flip-flops to receive the plurality of up flip-flop signals generated by the plurality of up flip-flops and configured to generate an OR signal based on the plurality of up flip-flop signals;
a plurality of down comparators in a one-to-one correspondence with the plurality of headroom detecting voltages, wherein each down comparator is configured to receive the corresponding headroom detecting voltage and the high headroom threshold voltage and to generate a down comparison signal by comparing the headroom detecting voltage with the high headroom threshold voltage;
a plurality of inverters in a one-to-one correspondence with the plurality of down comparators, wherein each inverter is coupled to the corresponding down comparator to receive the corresponding down comparison signal and is configured to generate an inverted down comparison signal based on the down comparison signal;
a plurality of down flip-flops in a one-to-one correspondence with the plurality of inverters, wherein each down flip-flop is coupled to the corresponding inverter to receive the corresponding inverted down comparison signal and is configured to generate a down flip-flop signal based on the inverted down comparison signal; and
an AND gate coupled to the plurality of down flip-flops to receive the plurality of down flip-flop signals generated by the plurality of down flip-flops and configured to generate an AND signal based on the plurality of down flip-flop signals.

* * * * *